United States Patent
Anderson et al.

(10) Patent No.: US 12,439,653 B2
(45) Date of Patent: Oct. 7, 2025

(54) MULTI-LAYER HYBRID EDGE TERMINATION FOR III-N POWER DEVICES

(71) Applicant: The Government of the United States of America, as represented by the Secretary of the Navy, Arlington, VA (US)

(72) Inventors: Travis J. Anderson, Alexandria, DC (US); Mona A. Ebrish, Alexandria, VA (US); Andrew D. Koehler, Alexandria, VA (US); Alan G. Jacobs, Rockville, MD (US); Matthew A. Porter, Virginia Beach, VA (US); Karl D. Hobart, Alexandria, VA (US); Prakash Pandey, Toledo, OH (US); Tolen Michael Nelson, Tecumseh, MI (US); Daniel G. Georgiev, Canton, MI (US); Raghav Khanna, Toledo, OH (US); Michael Robert Hontz, Drexel Hill, PA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 422 days.

(21) Appl. No.: 17/876,163

(22) Filed: Jul. 28, 2022

(65) Prior Publication Data
US 2023/0030549 A1    Feb. 2, 2023

Related U.S. Application Data

(60) Provisional application No. 63/227,364, filed on Jul. 30, 2021.

(51) Int. Cl.
*H10D 62/10*    (2025.01)
*H10D 8/00*    (2025.01)
*H10D 62/85*    (2025.01)

(52) U.S. Cl.
CPC ............ *H10D 62/105* (2025.01); *H10D 8/00* (2025.01); *H10D 62/8503* (2025.01)

(58) Field of Classification Search
CPC .. H10D 62/105; H10D 62/8503; H10D 8/422; H10D 8/045; H10D 8/50;
(Continued)

(56) References Cited

U.S. PATENT DOCUMENTS 7,759,186 B2    7/2010 Imhoff et al.
2007/0272977 A1*    11/2007 Saito .................. H10D 30/0291
                                                    257/E29.066

(Continued)

OTHER PUBLICATIONS

A.T. Binder et al. "Bevel Edge Termination for Vertical GaN Power Diodes," 2019 IEEE 7th Workshop on Wide Bandgap Power Devices and Applications (WiPDA), 2019, pp. 281-285.

(Continued)

*Primary Examiner* — Shahed Ahmed
(74) *Attorney, Agent, or Firm* — US Naval Research Laboratory; Jorie L. Stroup

(57) ABSTRACT

A hybrid edge termination structure and method of forming the same. The hybrid edge termination structure in accordance with the invention is based on a junction termination extension (JTE) architecture, but includes an additional Layer of guard ring (GR) structures to further implement the implantation of dopants into the structure. The hybrid edge termination structure of the invention has a three-Layer structure, with a top Layer and a bottom Layer each having a constant dopant concentration in the lateral direction, and a middle Layer consisting of a plurality of spatially defined alternating regions that exhibit the electrical properties of either the top or bottom layer. By including the second layer, a discretized varying charge profile can be obtained that approximates the varying charge profile obtained using (Continued)

tapered edge termination but with easier manufacturing and lower cost.

11 Claims, 10 Drawing Sheets

(58) Field of Classification Search
CPC ...... H10D 8/00–825; H10D 62/60–605; H01L 21/02538–02549
See application file for complete search history.

(56) References Cited

U.S. PATENT DOCUMENTS

| | | | |
|---|---|---|---|
| 2014/0070229 A1* | 3/2014 | Stum | H10D 18/00 257/77 |
| 2018/0114830 A1* | 4/2018 | Griebl | H01L 21/761 |

OTHER PUBLICATIONS

K. Zeng et al. Designing Beveled Edge Termination in GaN Vertical p i-n Diode-Bevel Angle, Doping, and Passivation, IEEE Transactions on Electron Devices, vol. 67, No. 6, pp. 2457-2462, Jun. 2020.
A.D. Koehler, "3D Nanoprinting of Grayscale Features in GaN Devices to Reduce Peak Electric Fields" CSManTech 2019.
H.-S. Lee et al., "Design and Fabrication of Vertical GaN p n Diode With Step Etched Triple-Zone Junction Termination Extension," IEEE Transactions on Electron Devices, vol. 67, No. 9, pp. 3553-3557, Sep. 2020.
H. Ohta et al., "High breakdown voltage vertical GaN p n junction diodes using guard ring structures," 2017 IEEE International Meeting for Future of Electron Devices, Kansai (IMFEDK), 2017, pp. 54-55.
W. Sung et al., "A New Edge Termination Technique for High-Voltage Devices in 4H-SiC-Multiple-Floating-Zone Junction Termination Extension," IEEE Electron Device Letters, vol. 32, No. 7, pp. 880-882, Jul. 2011.

* cited by examiner

Effect of Implant Depth on Hybrid Termination Performance

MULTI-LAYER HYBRID EDGE TERMINATION FOR III-N POWER DEVICES

CROSS-REFERENCE

This Application is a Nonprovisional of and claims the benefit of priority under 35 U. S. C. § 119 based on U.S. Provisional Patent Application No. 63/227,364 filed on Jul. 30, 2021. The Provisional Application and all references cited herein are hereby incorporated by reference into the present disclosure in their entirety.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing Navy Case #210617.

TECHNICAL FIELD

The present invention relates to GaN and other III-nitride power devices, particularly to edge termination structures and methods of forming such structures for electric field management in GaN and other III-nitride power devices.

BACKGROUND

GaN and related wide- and ultrawide-bandgap III-N semiconductor alloys (e.g. AlGaN, InAlGaN, AlN) exhibit many favorable properties for power devices, notably their tunable direct bandgap (0.7-6.1 eV), high saturation velocity, high mobility, and high breakdown field. This material system exhibits a substantially improved Baliga Figure of Merit (BFOM) for power switching compared to conventional Si or SiC technology. Technological challenges such as reliable substrate production and doping control in drift layers suitable for high voltage (1-20 kV) are being resolved, enabling renewed commercial interest in vertical power device technology such as P-i-N diodes, junction barrier Schottky (JBS) diodes, p-n junction-gated field effect transistors (JFETs), current aperture vertical electron transistors (CAVETs), double diffused metal oxide semiconductor field effect transistors (DMOS), and trench MOSFET devices. However, a significant technical challenge remains in electric field management for these device architectures. Appropriate edge termination is necessary for proper spreading of the electric field and achievement of avalanche breakdown necessary for realization of the full potential of the material.

Edge termination can be accomplished using various geometries. In one such approach, illustrated by the schematic in FIG. 1A, a bevel-edge structure formed on the surface of the device, wherein a region of lighter doping extends from the edge of the anode to the edge of an isolation region, can act as edge termination. See A. T. Binder et al. "Bevel Edge Termination for Vertical GaN Power Diodes," 2019 *IEEE 7th Workshop on Wide Bandgap Power Devices and Applications (WiPDA)*, 2019, pp. 281-285; K. Zeng et al. Designing Beveled Edge Termination in GaN Vertical p-i-n Diode-Bevel Angle, Doping, and Passivation," *IEEE Transactions on Electron Devices*, Vol. 67, No. 6, pp. 2457-2462, June 2020; and A. D. Koehler, "3D Nanoprinting of Grayscale Features in GaN Devices to Reduce Peak Electric Fields" CSMANTECH 2019. The dopant dose in this region is optimized to properly balance and shape the electric field.

Other commonly used edge termination approaches are junction termination extension (JTE) and guard rings (GR), also called Floating Field Rings (FFR). Variants on these basic designs have been developed for further field shaping. See J. Baliga, *Fundamentals of Power Semiconductor Devices*, Springer, pp. 107-132 (2008). Some of these approaches include grayscale JTE, an example of which is illustrated in FIG. 1C, and multi-zone JTE, an example of which is illustrated in FIG. 1C. See U.S. Pat. No. 7,759,186, to Imhoff et al., "Junction Termination Extension with Controllable Doping Profile and Controllable Width for High-Voltage Electronic Devices" (2010); and H.-S. Lee et al., "Design and Fabrication of Vertical GaN p-n Diode With Step-Etched Triple-Zone Junction Termination Extension," *IEEE Transactions on Electron Devices*, vol. 67, no. 9, pp. 3553-3557, September 2020. In both of these approaches, a laterally varying dopant dose is implemented through the width of the edge termination region.

In the GR approach, an example of which is shown in FIG. 2, floating regions of heavily doped material, spaced in rings of varying width and spacing, are utilized to distribute the electric field. See H. Ohta et al., "High breakdown voltage vertical GaN p-n junction diodes using guard ring structures," 2017 *IEEE International Meeting for Future of Electron Devices, Kansai (IMFEDK)*, 2017, pp. 54-55.

However, all these approaches have significant drawbacks. For example, the JTE approach requires non-planar processing, which can be difficult to implement, especially on a mass scale. In many cases, it is also difficult to achieve the low-angle bevel slope needed for effective termination. The GR approach also has its own difficulties. For example, avalanche breakdown is not possible with GR terminations and it is difficult to control the charge near the surface. See Ohta et al., supra.

In addition, the III-N material system presents several unique challenges, making the optimization of known JTE and GR-type structures in III-N devices even more challenging. First, control over p-type doping in the anode is difficult due to the high ionization energy of Mg and the known tendency to form electrically inactive complexes with other residual impurities such as hydrogen. Second, selective-area doping by ion implantation is extremely challenging and requires annealing at high temperature and elevated pressure to be successful, limiting volume manufacturing capability at present. For this reason, edge termination of GaN is typically limited to compensation doping of an epitaxial anode structure. Third, due to the wide bandgap nature of the material, the dose window for optimal edge termination efficiency is extremely small. Together, these factors combined make it extremely challenging to reliably achieve the appropriate thickness and doping levels required for known edge termination designs within the current constraints of III-N growth technology. A new solution is needed that is less sensitive to minor variations in anode dose.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a hybrid edge termination structure for electric field management in GaN and other III-N power device structures. The hybrid edge termination structure in accordance with the present invention is based on a junction termination extension (JTE) architecture, but includes an additional Layer of guard ring (GR) structures to further implement the implantation of dopants into the structure. The hybrid termination structure in accordance with the present invention has a three-Layer structure, with a top Layer and a bottom Layer each having a constant dopant concentration in the lateral direction, and a middle Layer consisting of a plurality of spatially defined alternating regions that exhibit the electrical properties of either the top or bottom layer. The combination of the top and bottom doped layers with the alternating doped regions in the middle layers enables the implementation of fine adjustments to the total charge dose in the edge termination region and produces a discretized charge profile that approximates the charge profile obtained from using a smoothly tapered (e.g., linear, convex, or concave) termination scheme.

BRIEF DESCRIPTION OF THE DRAWINGS

FIGS. 8A-8C illustrate further aspects of the performance of exemplary embodiments of a hybrid termination extension in a semiconductor device in accordance with aspects of the present invention.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a hybrid edge termination structure and method of forming such structures for electric field management in GaN and other III-N power device structures. The hybrid edge termination structure in accordance with the present invention is based on a junction termination extension (JTE) architecture, but implements an additional Layer of guard ring (GR) structures to finely adjust the total charge dose in the edge termination region. The edge termination structure in accordance with the present invention can be formed via active doping by ion implantation, compensation doping by ion implantation, or subtractive etching.

As described in more detail below, the hybrid termination structure in accordance with the present invention has a three-Layer structure, with a top Layer and a bottom Layer each having a constant dopant concentration in the lateral direction, and a middle Layer consisting of a plurality of spatially defined regions that exhibit the electrical properties of the top or the bottom Layer in an alternating sequence. The combination of the top and bottom doped layers with the alternating doped regions in the middle layers enables the implementation of fine adjustments to the total charge dose in the edge termination region and produces a discretized charge profile that approximates the charge profile obtained from using a tapered (e.g., linear, convex, or concave) termination scheme.

Figure 1A:
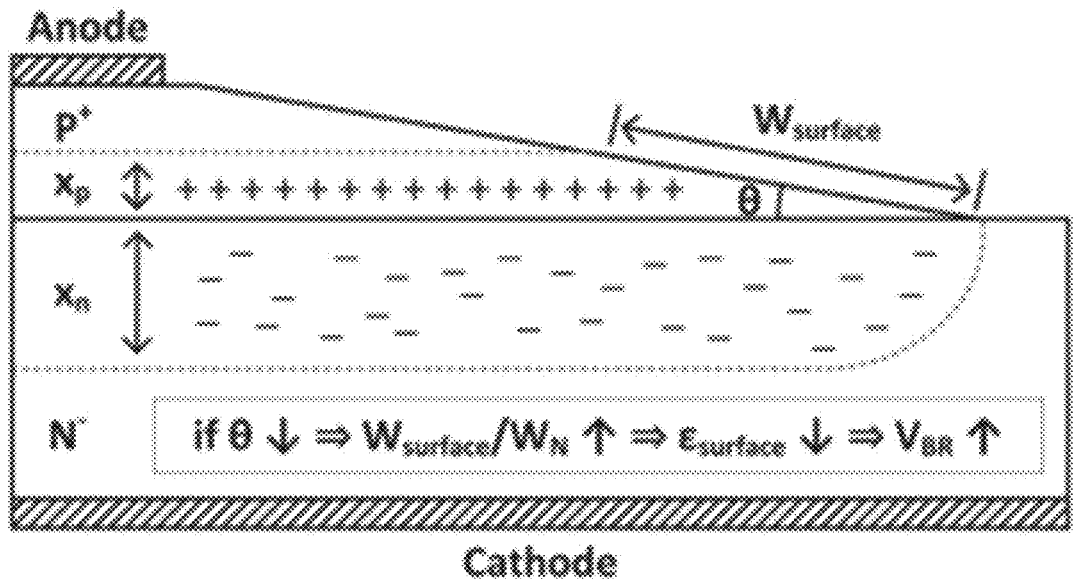
FIGS. 1A-1C are block schematics illustrating various exemplary implementations of anode edge termination in accordance with the prior art.
Figure 1B:
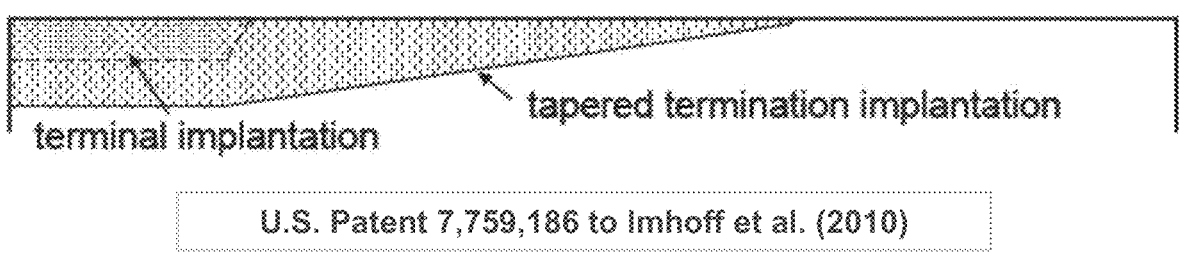
Figure 1C:
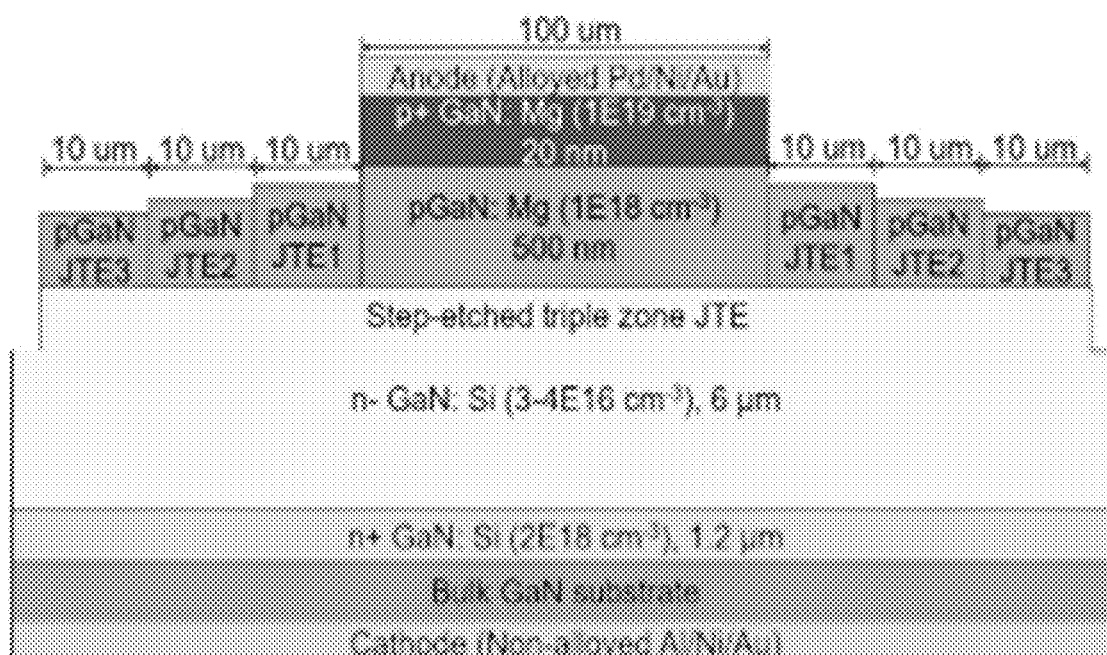
Figure 2:
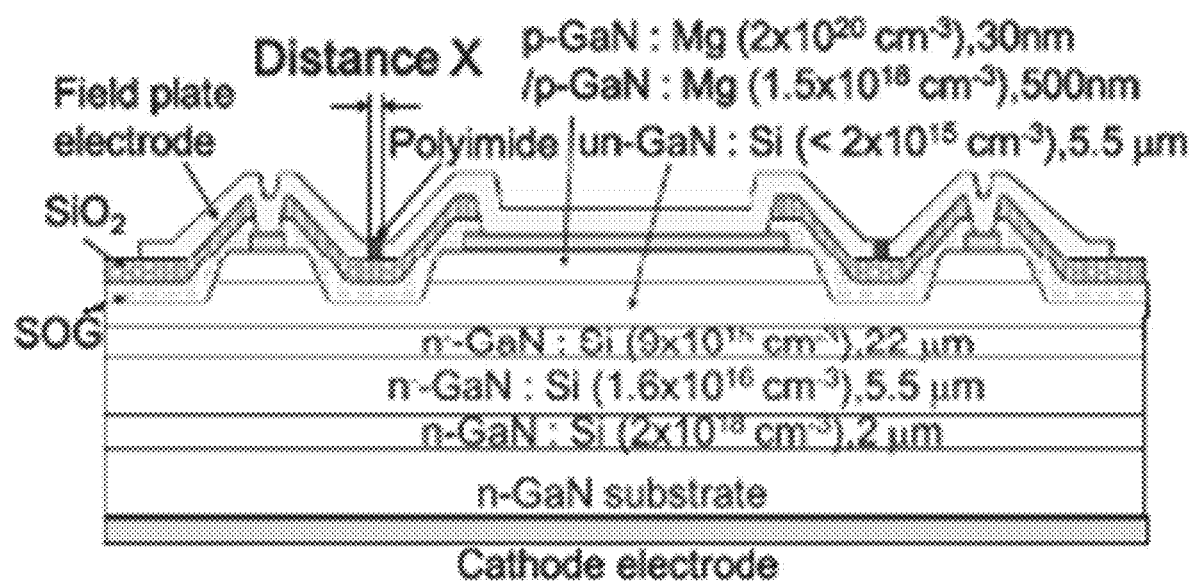
FIG. 2 is a block schematic illustrating an exemplary implementation of the guard ring (GR) approach for anode edge termination in accordance with the prior art.
Figure 3:
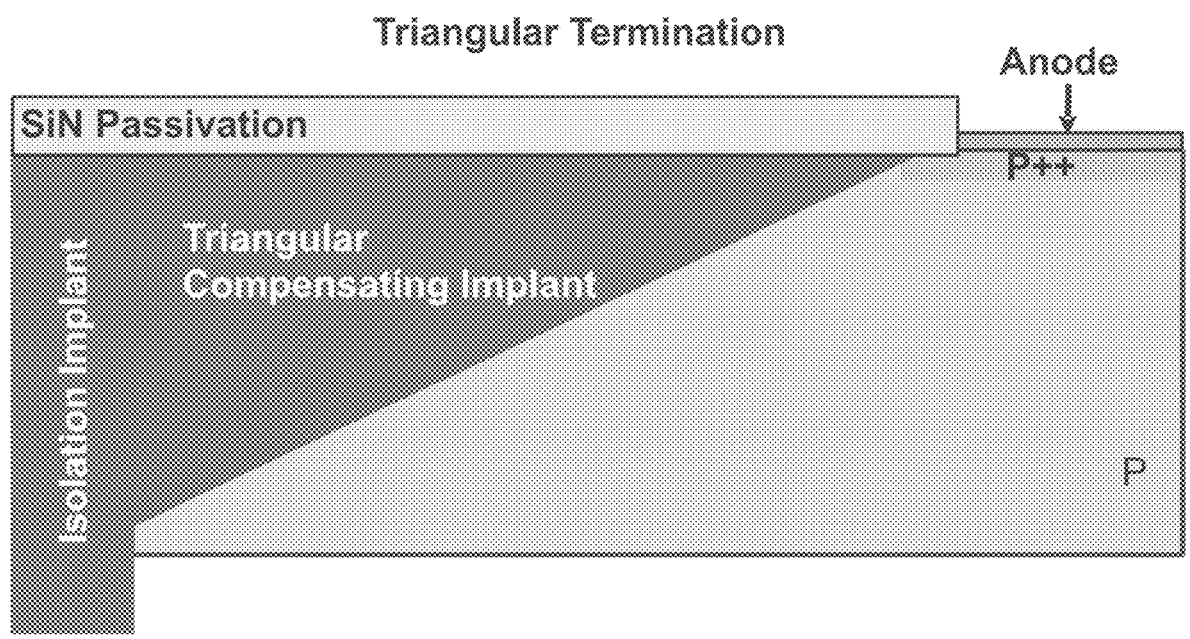
FIG. 3 is a block schematic illustrating a triangular implant approach for anode edge termination.

FIG. 3 is a block schematic illustrating an smoothly tapered edge termination scheme based on a compensating implant profile having a triangular configuration. However, this triangular implant requires the use of grayscale lithography, which is difficult and expensive to implement, and so is not practicable for large-scale use.

The hybrid termination structure of the present invention overcomes many of the shortcomings of tapered edge termination, and provides a charge profile that approximates the charge profile obtained from tapered edge termination, using a structure that can be readily reproduced and manufactured more easily and at at much lower cost.

Figure 4:
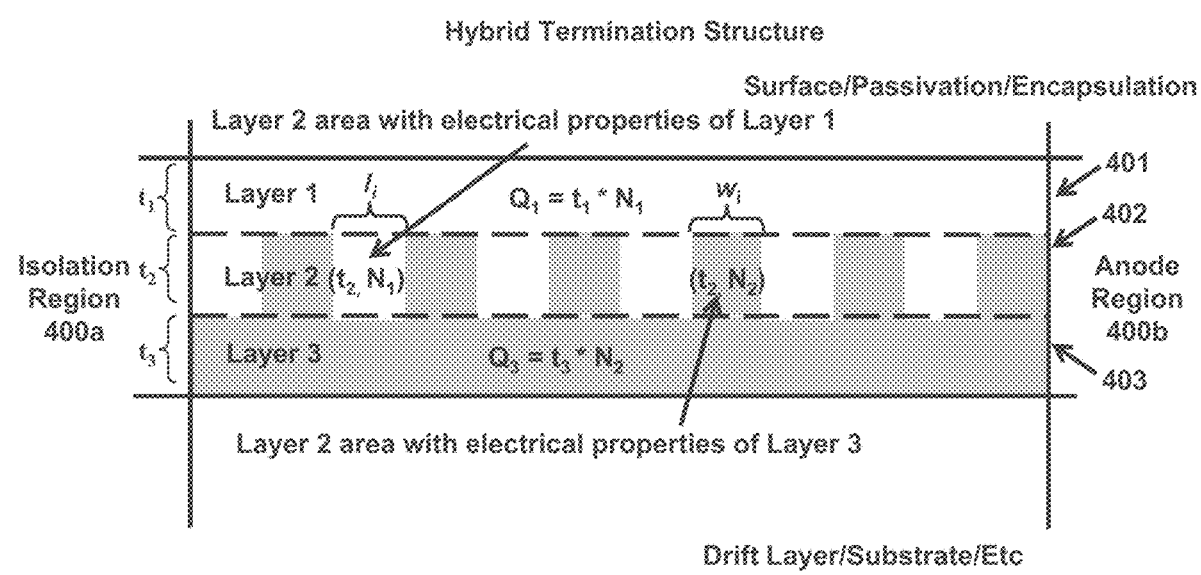
FIG. 4 is a block schematic illustrating basic aspects of a hybrid edge termination structure in accordance with the present invention.

The basic structure in accordance with the present invention is shown by the block schematic in FIG. 4.

Thus, as shown in FIG. 4, a hybrid edge termination structure in accordance with the present invention consists of a three-Layer structure, a top Layer 401 (Layer 1) having a corresponding thickness $t_1$, charge density $N_1$, and total charge $Q_1 = t_1 * N_1$ and a bottom Layer 403 (Layer 3) having a corresponding thickness $t_3$, charge density $N_2$, and total charge $Q_3 = t_3 * N_2$. In some embodiments, Layer 3 can be disposed on a substrate, while in other embodiments, it can be disposed on an intervening semiconductor Layer such as a drift layer. In some embodiments, a passivation Layer can be disposed on the top of Layer 1.

In many embodiments, Layer 1 and Layer 3 are GaN, where Layer 1 is n-type GaN and Layer 3 is p-type GaN or "compensated" GaN having a high resistivity due to damage caused by, e.g., nitrogen implantation. However, one skilled in the art will readily understand that the hybrid edge termination scheme in accordance with the present invention can be implemented where Layer 1 is p-type while Layer 3 is n-type or can be fabricated using other suitable materials having suitable doping.

In addition, in accordance with the present invention, the structure also includes a buried intermediate Layer 402 (Layer 2) between Layer 1 and Layer 3, where Layer 2 consists of a Layer in which JTE implant Layer 1 extends into Layer 3 in a series of predefined spaced-apart areas to form a plurality of alternating areas formed from the materials of Layers 1 and 3. In accordance with the present invention, any one or more of the depth $t_2$ to which JTE implant Layer 1 extends into Layer 3, the width $l_i$ of each spaced-apart area of JTE implant Layer 1 in Layer 2 and the spacing $w_i$ between the implanted areas can be predefined and tuned to achieve a predefined and optimized charge profile within the within the device structure.

As shown in FIG. 4, an isolation region 400a is typically situated on one end of the three-Layer termination structure, while an anode region 400b is situated at the other. While the embodiment shown in FIG. 4 is for a P-i-N GaN diode structure, the same process can be used for edge termination in any vertical device architecture, including junction barrier Schottky (JBS) diodes, p-n junction gated field effect transistors (JFET), current aperture vertical electron transistors (CAVET), double diffused metal oxide semiconductor field effect transistors (DMOS), and trench MOSFET devices, and all such devices are deemed to be within the scope of the present disclosure. In addition, although the hybrid edge termination structure is shown and described herein in the context of a p-doped device having n-doped edge termination, one skilled in the art will readily understand that the structures described herein can just as easily be applied to an n-doped device having p-doped edge termination, and all such structures and devices are deemed to be within the scope of the present disclosure.

Figure 5:
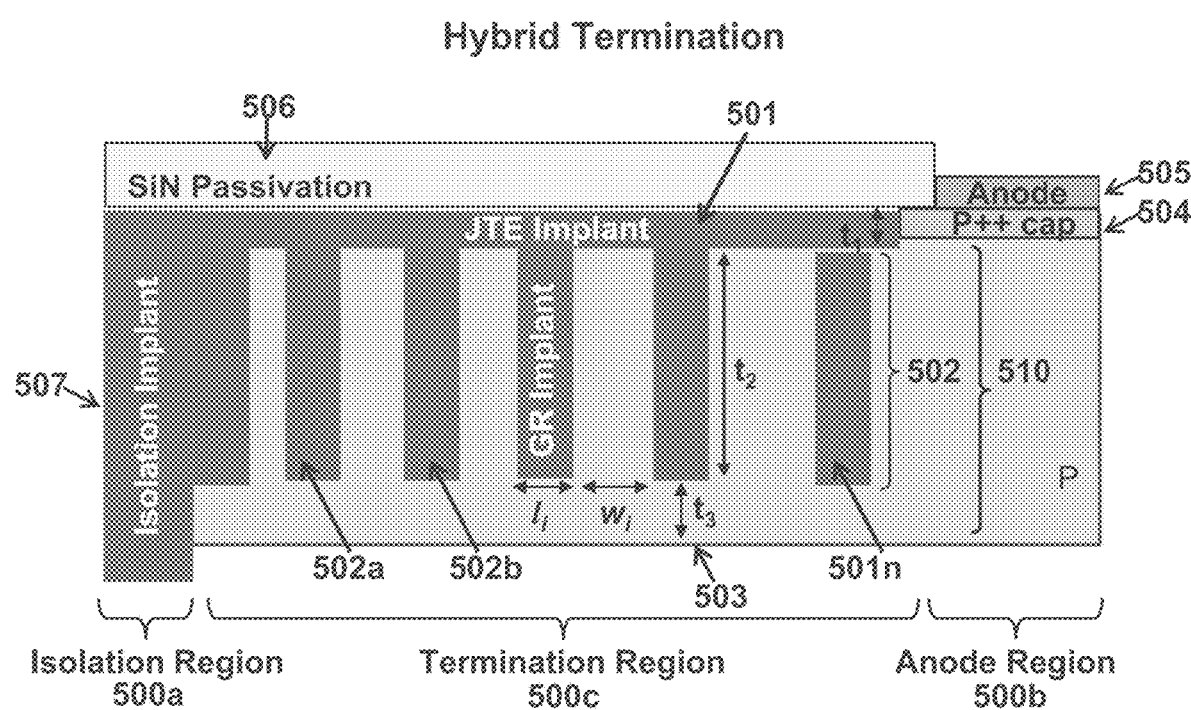
FIG. 5 is a block schematic illustrating an exemplary embodiment of a hybrid edge termination structure in accordance with the present invention.

The block schematic in FIG. 5 further illustrates the basic design of a hybrid edge termination structure in accordance with the present invention as incorporated into a typical epitaxial GaN diode structure. As shown in FIG. 5, the structure can be viewed as being divided into an Isolation Region 500a, an Anode Region 500b, and a Termination Region 500c situated between the Isolation and Anode regions.

As described above and as illustrated in FIG. 5, a hybrid edge termination structure in accordance with the present invention is in the form of a layered structure having a top JTE implant Layer 501 (Layer 1) having a thickness $t_1$ and a bottom base Layer 503 (Layer 3) having a thickness $t_3$, where Layer 3 is doped in one way and Layer 1 is doped in the opposite way, such that the top JTE implant Layer 501 has a charge concentration of $N_1$ and the bottom base Layer 503 has a charge concentration of $N_3$. In addition, as described in more detail below, the hybrid termination structure in accordance with the present invention further has a buried intermediate Layer (Layer 2) having a thickness $t_2$ and consisting of alternating fingers of JTE implant Layer 1 and unimplanted areas of Layer 3 arranged in a predefined pattern, where intermediate Layer 2 has a charge concentration that reflects the charge concentrations of Layers 1 and 3 and the number, width, and depth of the alternating fingers of JTE implant Layer 1 and unimplanted areas of Layer 3.

Top first Layer 501 in a hybrid edge termination structure in accordance with the present invention resembles an n-doped JTE implant in a conventional edge termination structure. However, unlike conventional JTE implants such as in the beveled edge, triangular, and multi-step JTEs described above, the top JTE implant Layer 501 in accordance with the present invention does not vary in thickness in the lateral direction, but has a uniform thickness of $t_1$ throughout its full extent in the structure.

In the exemplary embodiment illustrated in FIG. 5, bottom Layer 503 is a p-doped GaN Layer (P-GaN layer). In addition, as shown in FIG. 5, in some embodiments, Anode Region 500b of the diode structure further can include a p++ doped cap Layer 504 on an upper surface of the bottom P-GaN Layer 503 and an anode 505 formed on an upper surface of the cap layer, while in some embodiments, Termination Region 500c can include a SiN passivation Layer 506 formed on an upper surface of JTE implant Layer 501. Isolation Region 500a of the structure can include an isolation implant 507 outside of the termination implants which isolates the device from the edge of the chip to eliminate damage associated with singulating die.

In addition, as illustrated in FIG. 5, in accordance with the present invention, the structure further includes an intermediate Layer 502 comprising a plurality of GR-like implants in which top JTE implant Layer 501 extends into bottom Layer 503 in a plurality of spaced-apart implanted areas to form GR-like implanted areas 501a, 501b . . . 501n. Each of the spaced-apart GR-like implanted areas has the same depth $t_2$ such that the P-GaN Layer 503 at the bottom of each implanted area has a thickness $t_3$, so that the total thickness of the hybrid termination layer 510 equals $t_2+t_3$, though the width $l_i$ and spacing $w_i$ of the implanted areas may vary. As described below, in accordance with the present invention, any one or more of the thickness $t_1$ of the JTE implant Layer 501, the depth $t_2$ of each implanted guard-ring structure 502a, 502b, etc., in middle Layer 502, the thickness of the bottom Layer $t_3$ at each of the implanted areas, as well as the width $l_i$ of each of the implanted areas and the width $w_i$ of each of the unimplanted areas (i.e., the spacing of the implanted areas) can be tuned in order to create a predefined charge profile in the device.

The structure of Layer 1 (top Layer 501) shown in FIG. 5 can be fabricated utilizing ion implantation of one or more compensating species (such as N, C, Ar, O, or electrically active Si or Ge). Layer 2 is added to this structure by introducing a patterned spacer Layer (fabricated from a material such as $SiO_2$ or $SiN_x$), for implantation of the JTE implant of Layer 1 into one or more predefined regions of Layer 3 so as to form Layer 2 having a plurality of spatially separated GR implants 502a, 502b, etc. comprising the JTE implant Layer 1. The thickness of Layer 1 and the depth of the implantation of the JTE implant of Layer 1 into Layer 3 to form Layer 2 usually will be determined by the ion energy, with the structure of the implanted areas in Layer 2 being predetermined in order to obtain a predetermined charge profile in the device.

In some embodiments, these layers can be stacked vertically, which essentially superimposes the GR structure on the JTE, where the total charge in the termination extension region is grossly controlled by modulating the JTE region thickness and doping, but can also be finely controlled by modulating the GR region thickness, doping, and lateral design. In other embodiments, the edge termination structure can have a lateral design, in the form of regions having a constant periodicity, regions having varying spacings resembling a GR structure, or a linearly graded region resembling a grayscale termination. The design of this region would be known to one skilled in the art.

The total dopant dose Q in Termination Region 500c can be determined using the equations set forth below, i.e., $$Q=(t_1*N_1)+(t_3*N_2)+f(N_1,t_2,l_i)+f(N_2,t_2,w_i),$$

where $$f(N_1, t_2, l_i) = \frac{\sum N_i * t_2 * l_i}{w_{tot}},$$

$$f(N_2, t_2, w_i) = \frac{\sum N_2 * t_2 * w_i}{w_{tot}},$$

and $w_{tot} = \sum l_i + \sum w_i,$ and where $N_1$ is the charge density in the top JTE implant Layer 501, $N_2$ is the charge density in the bottom P-GaN Layer 503, and $f(N_1, t_2, l_i)+f(N_2, t_2, w_i)$ represents the total charge in in intermediate Layer 502, where $t_2$ is the depth of each implanted GR region, $l_i$, is the width of each implanted region i, $w_i$ is the width of each unimplanted region i and $w_{tot}$ is the total width of all the implanted and unimplanted regions.

In some embodiments, JTE implant Layer 501 can be a compensating species, in which case $N_1$ effectively equals zero, while in other embodiments JTE implant Layer 501 can be a dopant species wherein $N_1$ equals $N_{dopant}$, i.e., the active dopant charge.

From the equations above, it can be seen that the total dopant dose of the junction termination region is largely determined by the sum of the dopant concentrations of Layer 1 and Layer 3, while Layer 2 represents a much smaller contribution to the total dopant concentration. However, the contribution of the intermediate Layer is critical because it allows for control of the dose at levels smaller than is possible using epitaxial growth alone (i.e., less than about $1^{12}$ cm$^{-2}$). This level of control is necessary to achieve the optimum dopant dose in III-N devices.

Figure 6:
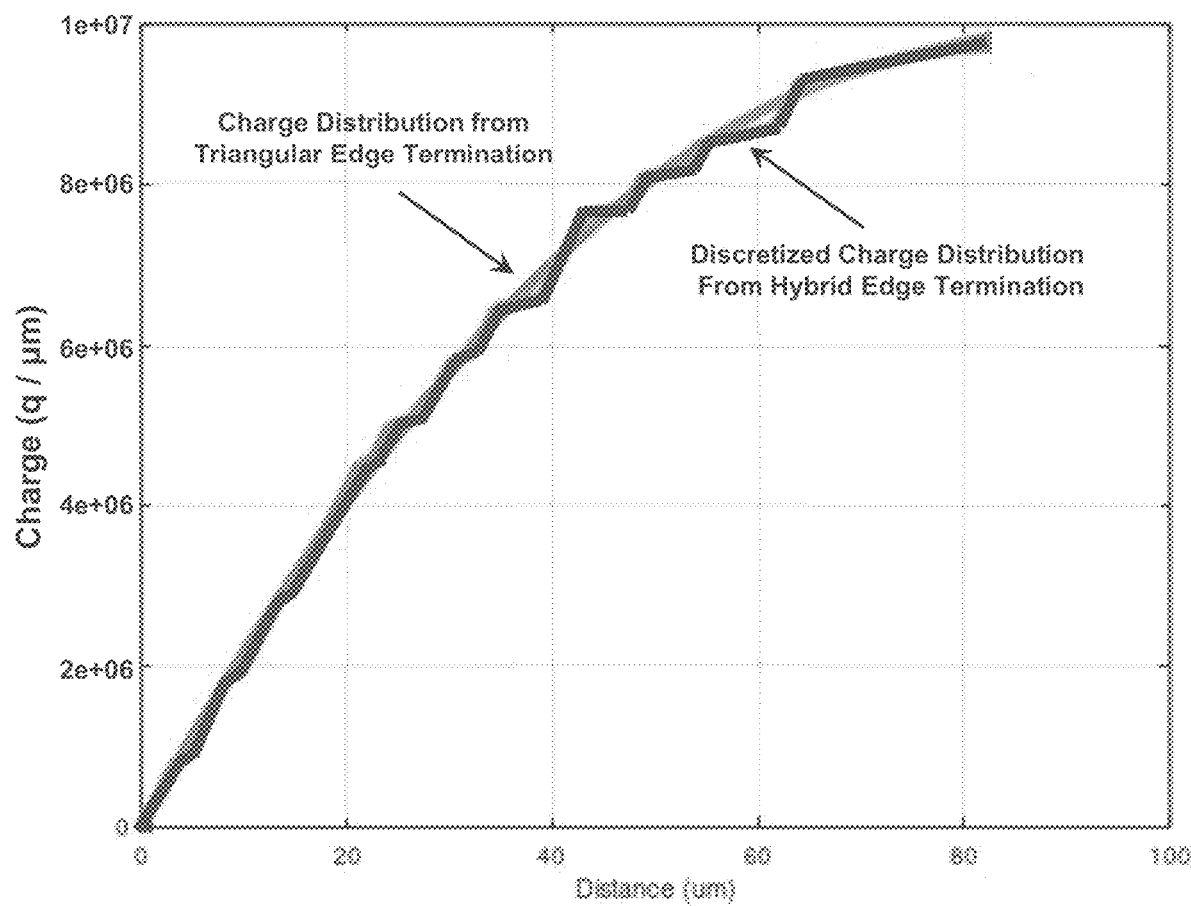
FIG. 6 is a plot illustrating how a hybrid edge termination in accordance with the prior art produces a discretized charge profile that approximates that obtained using a triangular dopant implant.

Thus, the hybrid termination structure of the present invention, which utilizes a series of implanted regions having a dopant type and/or dopant concentration that is different from that present in the base material, provides a discretized variation in charge profile in the base material. As illustrated by the pots shown in FIG. 6, this discretized variation in charge profile can closely approximate the variation in charge profile that can be obtained using a smoothly tapered (e.g., convex, concave, or linearly varying) junction termination approach. However, the hybrid termination approach of the present invention can accomplish such a variation in charge profile using simple standard photolithography and masking techniques to define the areas of the base material to be implanted in the JTE and GR regions, whereas tapered termination requires use of grayscale lithography and grayscale masks, which are difficult to produce and expensive to utilize.

Advantages and New Features

The main new feature introduced by the present invention is the buried intermediate Layer 2 with spatially varying charge. This is substantially different from a full guard ring, junction termination extension, or grayscale structure. Most notably, it is able to form charge profiles resembling a grayscale approach in a much more streamlined fabrication process. None of the alternative technologies in existence can achieve this feature. There is a clear optimal dose for edge termination to function efficiently, and a small window around that dose. By finely adjusting the dose via design of Layer 2 to be at the true optimal dose, one can tolerate some variation around that dose due to non-uniformity across the wafer. If one is not at the optimal dose in the epitaxial Layer design, breakdown voltage is substantially reduced and devices will not yield.

FIGS. 7A-7C, 8A-8C, and 9 illustrate aspects of additional advantages of a hybrid edge termination structure in accordance with the present invention.

Figure 7A:
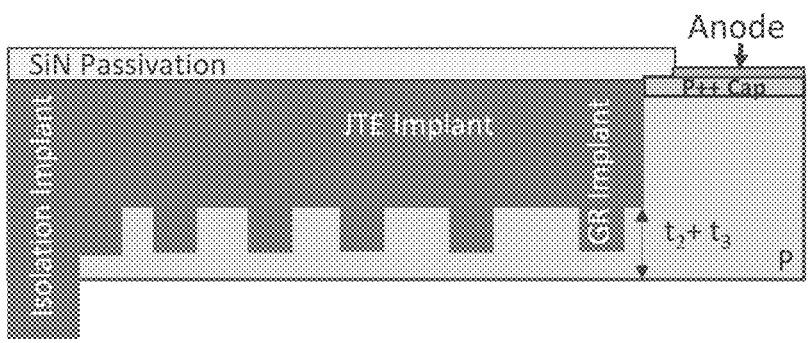
FIGS. 7A-7C illustrate aspects of the performance of exemplary embodiments of a hybrid termination extension in a semiconductor device in accordance with aspects of the present invention.
Figure 7B:
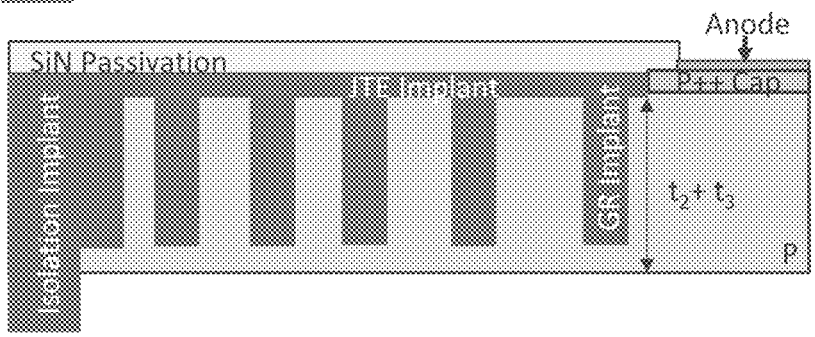
Figure 7C:
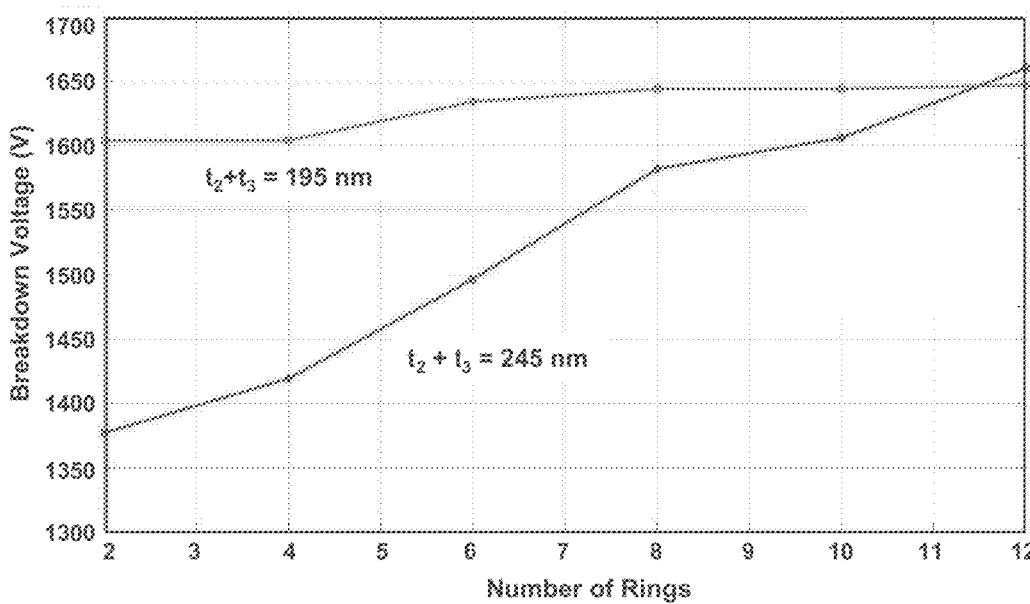

In FIGS. 7A-7C, two different implementations of the hybrid edge termination in accordance with the present invention are depicted. In both implementations, the total depth of each GR implant and the number of implanted regions are the same, but in one case, shown in FIG. 7A, JTE implant Layer 1 is deep and the GR implants in Layer 2 are shallow, resulting in a thin hybrid JTE region, while in the other case, shown in FIG. 7B, JTE implant Layer 1 is shallow and the GR implants in Layer 2 are deep, resulting in a relatively thick hybrid JTE region. In the FIG. 7A case, where JTE implant Layer 1 is thick (i.e., the hybrid JTE region is thin), the JTE implant acts as a single zone JTE, independent of the number, spacing, or depth of the GR implantations, as shown by the plot in FIG. 7C which shows a stable breakdown voltage across a number of rings varying from 2 to 12. In contrast, in the FIG. 7B case, where JTE implant Layer 1 is shallow and the GR implants are deep, resulting in a thick hybrid JTE region, breakdown voltage improves as the number of GR implants increases, as shown by the plot in FIG. 7C, so that when more than 10 GR implants are present, the charge profile mimics the charge profile obtained by a conventional 0.155 degree bevel angle edge termination. Thus, in accordance with the present invention, by tuning the depth of the JTE implant Layer 1, a junction termination having a predetermined charge profile that approximates that obtained by a conventional bevel angle edge termination can be obtained.

Figure 8C:
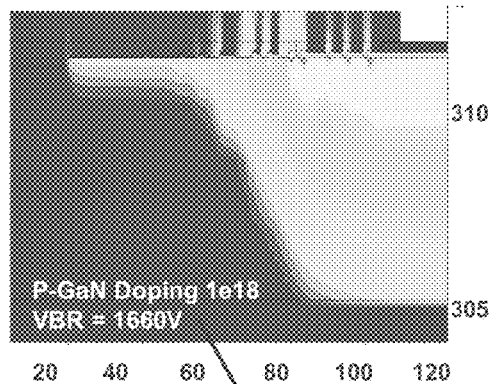
Figure 8C:
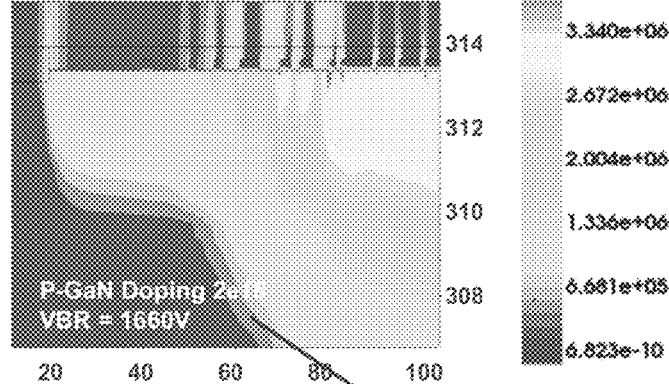
Figure 8C:
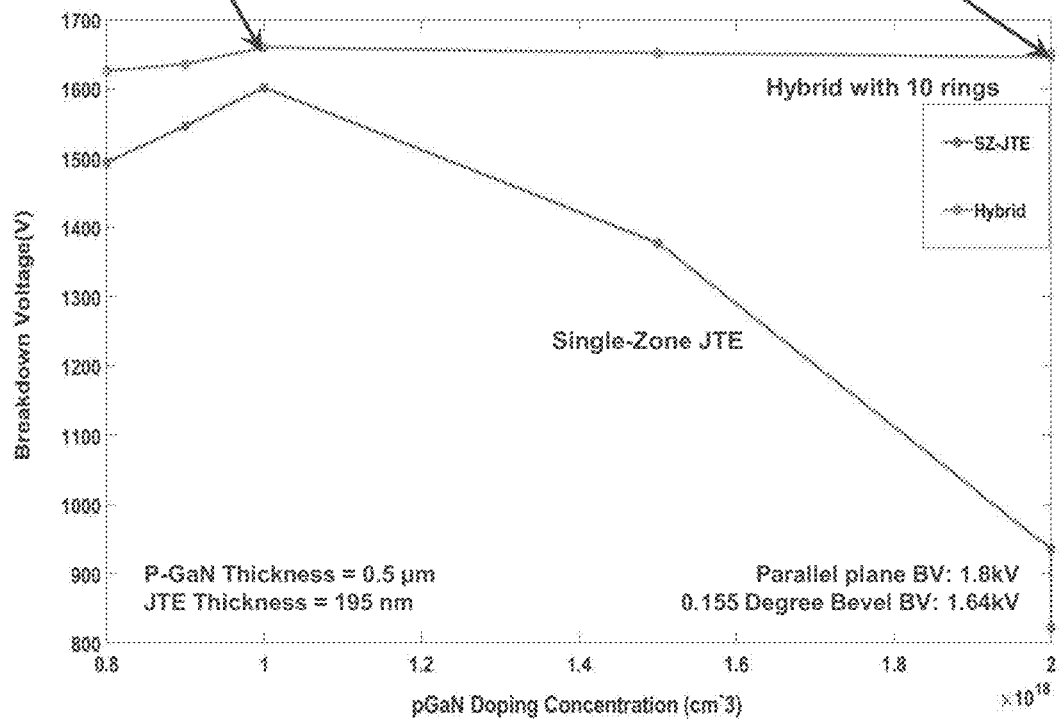

FIGS. 8A-8C further illustrate some of the advantages of incorporating a hybrid edge termination structure in accordance with the present invention into high-power electronic devices. As shown by the plot in FIG. 8C, the breakdown voltage of GaN devices having single-zone JTE is very sensitive to the level of p-type doping in the GaN (p-GaN), with breakdown voltage varying from about 1600 V at a p-GaN doping concentration of $1\times10^{18}$ cm$^{-3}$ (FIG. 8A) to about 1000 V at p-GaN doping concentration of $2\times10^{18}$ cm$^{-3}$ (FIG. 8B) Adding the GR implants to the JTE implant in accordance with the present invention reduces this sensitivity to variations in the p-type dopant concentration, with the breakdown voltage being essentially stable between these two doping levels, as shown by the plot in FIG. 8C. In addition, increasing the p-type doping in GaN spreads the electric field towards the outer rings, enabling the maintenance of a high breakdown voltage.

Figure 9:
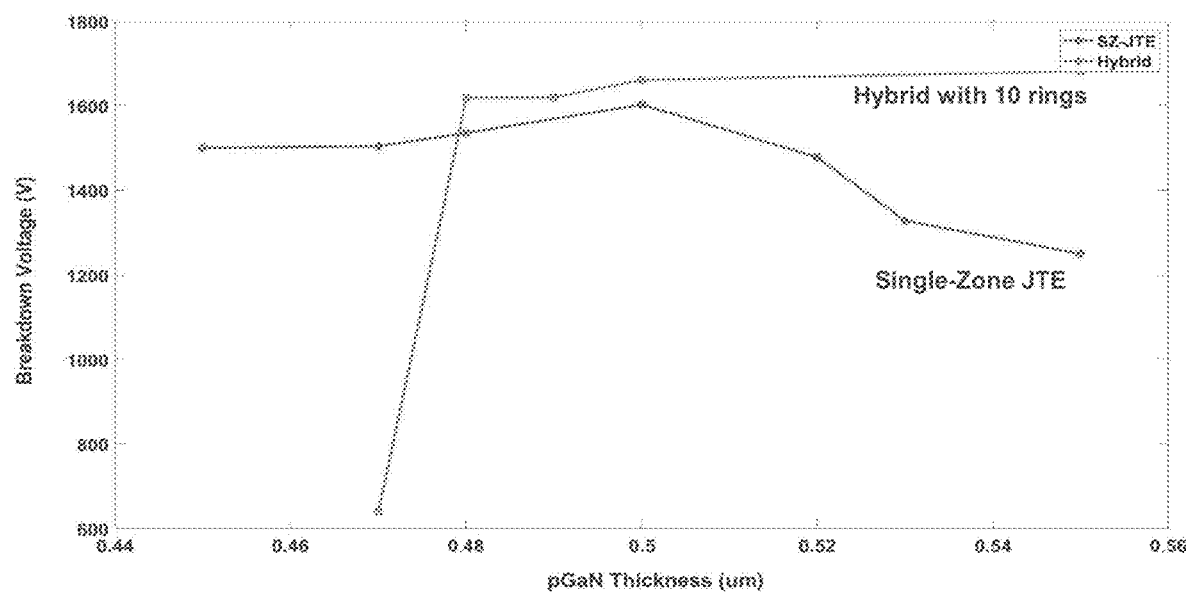
FIG. 9 illustrates illustrate still further aspects of the performance of exemplary embodiments of a hybrid termination extension in a semiconductor device in accordance with aspects of the present invention.

Similarly, as illustrated by the plot in FIG. 9, the hybrid edge termination structure in accordance with the present invention is tolerant of variations in the p-GaN Layer thickness, so long as the GR implant depth is not deeper than the base p-GaN thickness, essentially creating an isolation implant.

Alternatives

As noted above, the structure of Layer 1 and Layer 3 shown in FIG. 5 can be fabricated utilizing ion implantation of one or more compensating species (such as N, C, Ar, O, or electrically active Si or Ge), with the depth of the GR implant defined by the ion energy profile of Layers 1 and 3 and Layer 2 being added via use of a patterned spacer Layer to control the distribution of the JTE implants into Layer 3.

Alternatively, a multi-step etch approach could be used to remove a depth of material in one or more predefined regions, followed by blanket etching to thin the entire edge termination region to a pre-determined thickness.

In other embodiments, an intentional doping species (such as Mg or Be) could be introduced to a bare drift Layer utilizing the implant spacer process to form a similar design.

While similar levels of charge control can be achieved by conventional multi-zone JTE or grayscale lithography, both of these approaches have significant drawbacks, making them unsuitable for large-scale manufacturing. The multi-zone JTE approach it requires many lithography and implantation steps, while the grayscale technique requires expensive and specialized masks or manufacturing equipment. In contrast, in the hybrid termination approach of the present invention, the relative thickness and charge profiles of Layer 1, Layer 2, and Layer 3 can be controlled by epitaxial growth, implant profile design, and spacer thickness. Thus, this full structure can be achieved by a single implant step and 2 lithography steps, representing a significant improvement over conventional techniques.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A hybrid edge termination structure in a semiconductor device, comprising:
   a first layer, a third layer, and a second layer between the first and the third layers;
   the first layer formed from a III-nitride semiconductor material having a first doping type and a first charge concentration $N_1$;
   the third layer formed from the III-nitride semiconductor material having a second doping type different from the first doping type and having a second charge concentration $N_2$; and
   the second layer comprising a plurality of alternating first and second lateral regions in contact with both the first layer and the third layer, wherein the first lateral regions are comprised of the III-nitride semiconductor material at the first doping type and the first charge concentration $N_1$, and the second lateral regions are comprised of the III-nitride semiconductor material at the second doping type and the second charge concentration $N_2$.

2. The hybrid edge termination structure according to claim 1, wherein the first layer is an n-type material and the third layer is a p-type material.

3. The hybrid edge termination structure according to claim 2 wherein the first layer is n-type gallium nitride (GaN) and the third layer is p-type GaN.

4. The hybrid edge termination structure according to claim 1, wherein the first layer is a p-type material and the third layer is an n-type material.

5. The hybrid edge termination structure according to claim 4, wherein the first layer is p-type GaN and the third layer is n-type GaN.

6. The hybrid edge termination structure according to claim 1, further comprising an anode terminal disposed on the first layer.

7. The hybrid edge termination structure according to claim 6, further comprising a p++ cap layer disposed between the first layer and the anode.

8. The hybrid edge termination structure according to claim 1, wherein the structure is arranged in a vertical configuration.

9. The hybrid edge termination structure according to claim 1, further comprising a passivation layer disposed on an upper surface of the structure.

10. The hybrid edge termination structure according to claim 1, further comprising an isolation implant disposed on a lateral edge of the structure.

11. The hybrid edge termination structure according to claim 1, wherein the first layer is doped with one or more compensating species selected from the group consisting of: nitrogen (N), carbon (C), argon (Ar), oxygen (O), electrically active silicon (Si), electrically active germanium (Ge), and combinations thereof.

* * * * *